United States Patent [19]

Smith et al.

[11] Patent Number: 4,516,082
[45] Date of Patent: May 7, 1985

[54] AMPLIFIER CIRCUIT FOR MINIMIZING OUTPUT VOLTAGE POWER-UP TRANSIENTS

[75] Inventors: Michael D. Smith, Lewisville; Roger A. Whatley, Austin, both of Tex.

[73] Assignee: Motorola, Inc., Schaumburg, Ill.

[21] Appl. No.: 583,064

[22] Filed: Feb. 23, 1984

[51] Int. Cl.³ .............................................. H03F 3/16
[52] U.S. Cl. .................................. 330/296; 330/253; 330/261
[58] Field of Search ............... 330/51, 253, 261, 296, 330/129, 130, 139, 149; 455/194, 212

[56] References Cited

U.S. PATENT DOCUMENTS 3,622,900  11/1971  Hanus et al. ..................... 330/261 X Primary Examiner—James B. Mullins
Assistant Examiner—Steven J. Mottola
Attorney, Agent, or Firm—Anthony J. Sarli, Jr.; Jeffrey Van Myers; Robert Lee King

[57] ABSTRACT

An amplifier circuit minimizes output voltage transients during powering up of the circuit. First and second bias current source portions are coupled to an input portion for receiving an input voltage. An amplifier portion is coupled to the input portion. The first bias current source portion provides a constant minimal current to the input portion which maintains the circuit bias voltage to the amplifier portion at near quiescent operating conditions. The second bias current source portion is switched to the input portion in response to a power control signal and provides bias current to the input portion necessary for circuit operation.

15 Claims, 5 Drawing Figures

AMPLIFIER CIRCUIT FOR MINIMIZING OUTPUT VOLTAGE POWER-UP TRANSIENTS

FIELD OF THE INVENTION

The invention relates to amplifier circuits used in audio applications, and more particularly, to an amplifier circuit for minimizing output voltage transients.

BACKGROUND OF THE INVENTION

A typical problem with audio circuits exists when the circuit is powered up from an inactive or off state. In audio stereo systems which have a large power supply, the problem is not severe due to the fact that the voltage through the power supply is slewed. As a result, noise spikes are rarely coupled to an output. When noise suppression circuitry is used, the circuitry typically suppresses noise in the associated power supply circuitry. However, in audio applications such as a telephone receiver, a power supply at the telephone receiver is not present since power is sent through the telephone line. Because telephone receivers are often powered up and down, output transient voltage spikes may exist every time the telephone receiver is powered up. Such voltage spikes may be objectionable when coupled to a speaker or earpiece.

SUMMARY OF THE INVENTION

An object of the present invention is to provide an improved amplifier output voltage transient suppression circuit.

Another object of the invention is to provide an amplifier circuit which suppresses power-up voltage transients from reaching the output thereof.

Yet another object of the invention is to provide an amplifier having a differential input which can be powered up from an inactive state without coupling voltage transients to the output thereof.

In carrying out the above and other objects and advantages of the present invention, there is provided, in one form, an amplifier circuit having an input portion for receiving an input voltage and an output portion for providing an output voltage. A first current source is coupled to the input portion for providing a bias current to the input portion. A second current source is coupled in parallel to the first current source for providing a predetermined minimal bias current to the input portion. A switching portion is coupled to the first current source for disabling the first current source in response to a control signal which powers down the amplifier circuit.

The above and other objects, features and advantages of the present invention will be more clearly understood from the following detailed description taken in conjunction with the following drawings.

DETAILED DESCRIPTION OF THE PRESENT INVENTION

Figure 1:
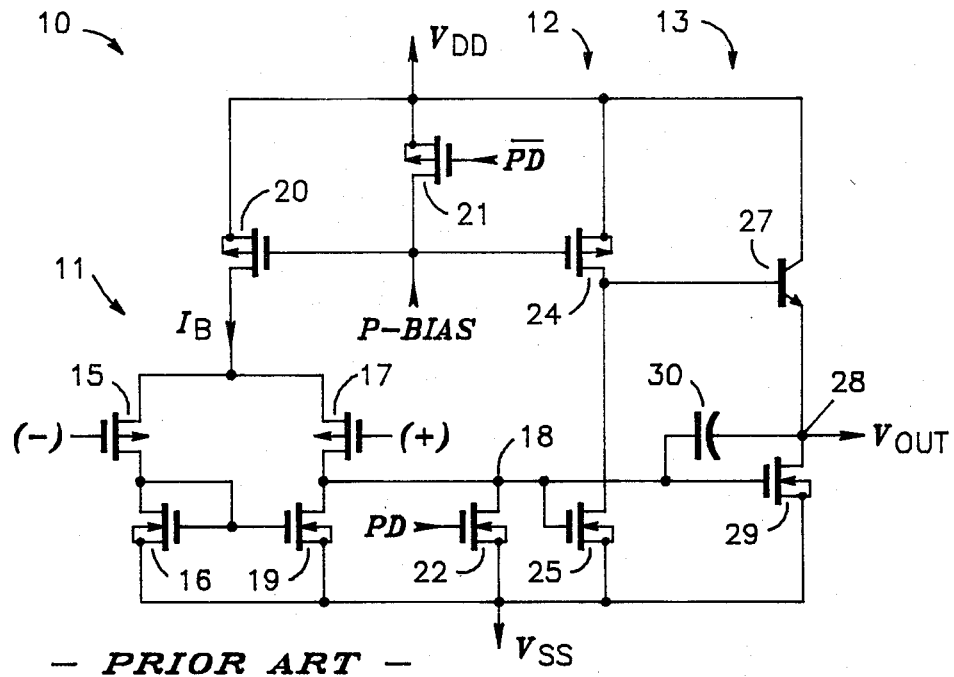
FIG. 1 is an operational amplifier circuit in schematic form which is known in the art.

Shown in FIG. 1 is an amplifier circuit 10 known in the art comprising a differential input portion 11, an amplifier portion 12 and an output buffer portion 13. Amplifier circuit 10 as illustrated is commonly referred to as an operational amplifier.

In differential input portion 11, a P-channel transistor 15 has a gate which forms an inverting input terminal and has a source and a drain. The drain of transistor 15 is connected to a drain of an N-channel transistor 16 which has its drain connected to its gate. A source of transistor 16 is connected to a supply voltage $V_{SS}$. A P-channel transistor 17 has a source connected to the source of transistor 15, a gate which forms a noninverting input terminal, and a drain which is connected to a drain of an N-channel transistor 19 via a node 18. A gate of transistor 19 is connected to the gate of transistor 16, and a source of transistor 19 is connected to supply voltage $V_{SS}$. In a common implementation, a substrate of each of transistors 15 and 17 is connected to a supply voltage $V_{DD}$ which is more positive than $V_{SS}$, and the source of each of transistors 16 and 19 is connected to its respective substrate. A P-channel transistor 20 has a source connected to supply voltage $V_{DD}$, a gate connected to a P-bias voltage, and a drain connected to the sources of transistors 15 and 17. A P-channel transistor 21 has a source connected to supply voltage $V_{DD}$, a gate connected to an active low form of a power down control signal, PD, and a drain connected to the gate of transistor 20 and to the P-bias voltage to form a P-bias node. In a common implementation, a substrate of each of transistors 20 and 21 is connected to its respective source and to supply voltage $V_{DD}$. An N-channel transistor 22 has a drain connected to the drain of transistor 17 at node 18, a gate connected to an active high form of a power down signal, PD, and a source connected to supply voltage $V_{SS}$. A substrate of transistor 22 is commonly coupled to its drain and to $V_{SS}$.

In amplifier portion 12, a P-channel transistor 24 has a source connected to supply voltage $V_{DD}$, a gate connected to the gate of transistor 20 and the P-bias voltage, and a drain. A substrate of transistor 24 is commonly connected to its source and to $V_{DD}$. An N-channel transistor 25 has a drain connected to the drain of transistor 24. A gate of transistor 25 is connected to the drain of transistor 22, and a source of transistor 25 is connected to supply voltage $V_{SS}$. In a common embodiment, the source of transistor 25 is connected to its own substrate.

In output buffer portion 13, an NPN bipolar transistor 27 has a collector connected to supply voltage $V_{DD}$, a base connected to the drain of transistor 24, and an emitter connected to an output terminal 28 for providing an output voltage $V_{OUT}$. An N-channel transistor 29 has a drain connected to output terminal 28, a gate connected to the drain of transistor 17, and a source connected to supply voltage $V_{SS}$. A frequency compensation capacitor 30 has a first electrode connected to the gate of transistor 29 and a second electrode connected to output terminal 28. In a common implementation, the source of transistor 29 is connected to its substrate.

Figure 2:
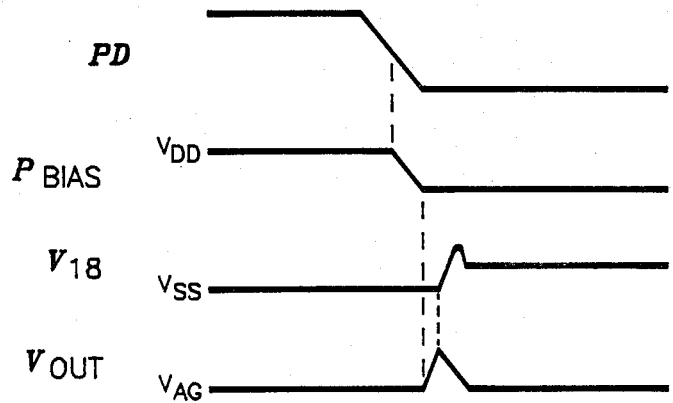
FIG. 2 is a plurality of waveforms associated with the circuit of FIG. 1.

Since the general operation of amplifier circuit 10 is well known, conventional details of operation will not be discussed and the discussion will be directed to associated disadvantages with powering up amplifier circuit 10. Shown in FIG. 2 are waveforms illustrating the powering up of amplifier circuit 10. In general, when control signal PD is at a low logic level, transistors 21 and 22 are nonconductive and all other transistors are conductive so that circuit 10 provides an output voltage $V_{OUT}$ which is proportional to the difference between voltages applied to the inverting and noninverting input terminals. When control signal PD is at a logic high level representing a power down mode, transistors 21 and 22 are conductive. Transistor 21 disables transistors 20 and 24 and prevents transistors 20 and 24 from supplying operating current to all other transistors in input portion 11, amplifier portion 12 and output buffer portion 13. In the power down mode, the P-bias node which is formed by the connection of the gates of transistors 20 and 24 is at $V_{DD}$ volts. Simultaneously, node 18 is connected directly to $V_{SS}$. The output voltage $V_{OUT}$ at this time is floating and essentially disabled with no power flow through amplifier circuit 10.

If a speaker type output load is coupled to node 28 during a transition to the power up mode, i.e. the PD signal goes from high to low, a large transient voltage spike occurs at the output as shown in FIG. 2. This large transient may be audible and objectionably loud. When powering up, the potential at the gates of transistors 20 and 24 is allowed to return from $V_{DD}$ to a normal P-bias level. Similarly, during power up, node 18 is allowed to increase from $V_{SS}$ volts to its normal quiescent condition which is determined in part by the input voltages. As the P-bias voltage at the gates of transistors 20 and 24 returns to a normal P-bias level, a bias current $I_B$ flows through transistor 20 and is divided through transistors 15 and 17. Simultaneously, the normal P-bias level makes transistor 24 conductive. Because transistor 24 is in the amplifier portion, much more current will flow through transistor 24 than through transistor 20. The larger current which flows through transistor 24 is amplified significantly by transistor 27 so that an output current which is several hundred times greater than the current $I_B$ which flows through transistor 20 is available for the output load. If transistors 15 and 17 are matched devices, approximately one-half of the bias current $I_B$ is coupled to node 18 via transistor 17. Since node 18 is slewed by approximately $\frac{1}{2}(I_B)$ and a large bias current is immediately available to the output through transistor 27, transistor 29 will not become conductive fast enough to shunt to $V_{SS}$ the large output current which is immediately available. Because amplifier circuit 10 is initially in an open loop gain configuration due to the powered-down state, no gain or functional feedback mechanisms exist initially upon power-up to limit the large current which is supplied at node 28. The problem is further aggravated by the presence of capacitor 30 which is present for frequency compensation purposes. Node 18 must quickly charge capacitor 30 to make transistor 29 conductive thereby compensating for the large output current. However, node 18 cannot change quickly because of the limited amount of current available from transistor 20. Thus, the output voltage spike illustrated in FIG. 2 occurs.

Figure 3:
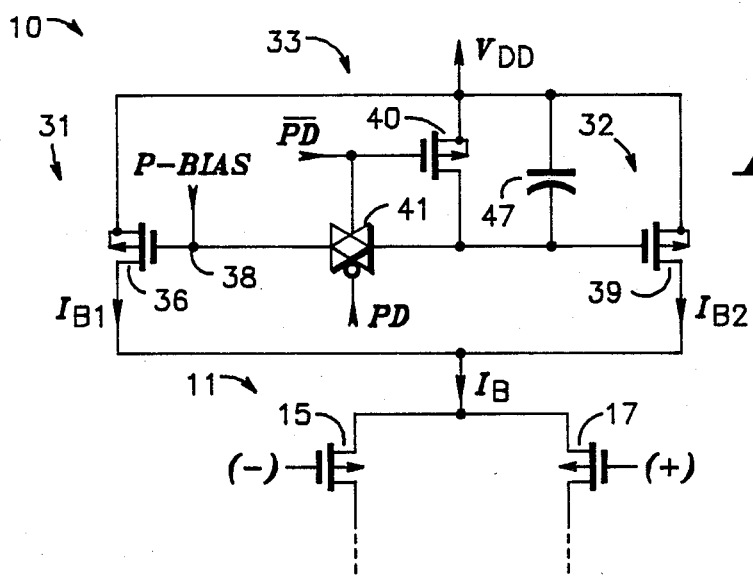
FIG. 3 is a circuit for suppressing voltage transients in schematic form in accordance with the present invention.

Shown in FIG. 3 is a schematic diagram of a portion of amplifier circuit 10 of FIG. 1 which is modified by being constructed in accordance with the present invention. The portion of amplifier circuit 10 which is illustrated comprises generally input portion 11 as previously described, a first current source portion 31, a second current source portion 32, and a switch portion 33. FIG. 1 is further modified when used in conjunction with the circuit of FIG. 3 by deleting transistor 22.

The first current source portion 31 comprises a P-channel transistor 36 for providing a bias current $I_{B1}$ having a source connected to supply voltage $V_{DD}$, a gate connected to a P-bias voltage at a node 38, and a drain connected to the sources of transistors 15 and 17. The second current source portion 32 comprises a P-channel transistor 39 for providing a bias current $I_{B2}$ having a source connected to supply voltage $V_{DD}$, a gate, and a drain connected to the sources of transistors 15 and 17.

Switch portion 33 comprises a P-channel transistor 40 having a source connected to supply voltage $V_{DD}$, a gate connected to the active low form of the power down signal PD, and a drain. A CMOS switch 41, commonly known as a transmission gate, has a first terminal connected to both the P-bias voltage and gate of transistor 36. A second terminal of switch 41 is connected to the drain of transistor 40 and the gate of transistor 39. An N-channel control terminal of switch 41 is connected to the active low form of the power down signal, and a P-channel control terminal of switch 41 is connected to the active high form of the power down signal. In a preferred form, the substrates of transistors 15, 17, 36, 39 and 40 are connected to supply voltage $V_{DD}$.

A capacitor 47 has a first electrode connected to supply voltage $V_{DD}$ and a second electrode connected to the gate of transistor 39. Capacitor 47 is a slewing capacitor used for limiting rise and fall times of voltages on the gate of transistor 39 and is an optional feature of the present invention.

In operation, transistor 36 functions to provide a constant trickle bias current $I_{B1}$ into input portion 11 of amplifier 10. This means that the P-bias voltage at node 38 does not go to $V_{DD}$ volts but stays at its quiescent condition. When the circuit configuration of FIG. 3 is used in amplifier circuit 10 of FIG. 1 and transistor 22 is deleted, node 18 will also remain near its quiescent condition. Switch 41 and transistor 40 function to selectively open circuit or turn off transistor 39 in response to the power down control signal PD. When amplifier circuit 10 is not powered down, transistor 39 is biased by the P-bias voltage to be conductive and provides a bias current $I_{B2}$ which is added with $I_{B1}$ to create a bias current $I_B$ which is sourced to transistors 15 and 17. When amplifier circuit 10 is powered down, only transistor 36 provides a bias current to transistors 15 and 17. However, this minimal bias current is sufficient to maintain node 18 near the quiescent voltage level. The effect of this is to allow output transistor 29 (FIG. 1) to become conductive immediately when the output voltage begins to increase in response to powering up. Therefore, potential voltage spikes in the output are greatly reduced since transistor 29 can now quickly shunt current from transistor 27.

Figure 4:
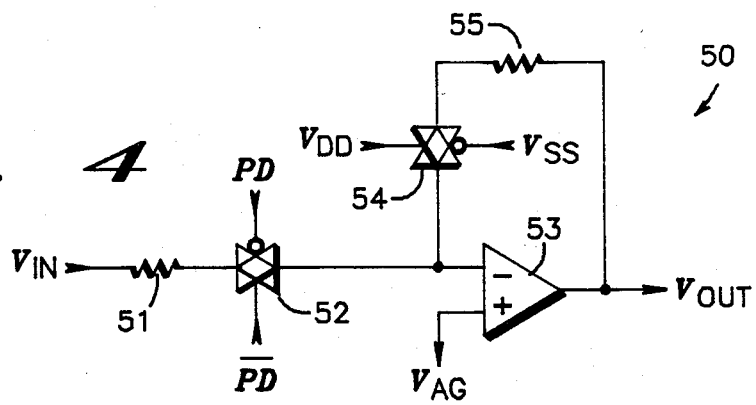
FIG. 4 is an operational amplifier circuit in partial schematic form utilizing the present invention.

Shown in FIG. 4 is an operational amplifier circuit 50 embodying the present invention. An input voltage $V_{IN}$ is connected to a first terminal of a resistor 51. A second terminal of resistor 51 is connected to a first terminal of a switch 52 implemented by a CMOS transmission gate having a P-channel control electrode connected to the active high form of power down signal PD and an N-channel control electrode connected to the active low form of the power down signal PD. A second terminal of switch 52 is connected to both the inverting input of an operational amplifier 53 and a first terminal of a switch 54 implemented by a CMOS transmission gate. A P-channel control electrode of switch 54 is connected to supply voltage $V_{SS}$, and an N-channel control electrode of switch 54 is connected to supply voltage $V_{DD}$. A second terminal of switch 54 is connected to a first terminal of a feedback resistor 55, and a second terminal of resistor 55 is connected to an output of operational amplifier 53. A noninverting input of operational amplifier 53 is connected to an analog ground voltage, $V_{AG}$.

In operation, when switch 52 is nonconductive, the output of operational amplifier 53 is at $V_{AG}$. Since the output is halfway between $V_{DD}$ and $V_{SS}$, it will only have to slew one-half of the voltage range when the circuit becomes operative. Operational amplifier circuit 50 incorporates the present invention of FIG. 3 into operational amplifier 53 to provide an output voltage which quickly slews to either supply voltage and which does not have output voltage spikes resulting from power up. The purpose of switch 54 is to function as a compensation for switch 52 by matching the impedances associated with switch 52. When the impedances are matched, associated parasitic effects are neutralized and an accurate gain may be obtained from circuit 50. The gain of circuit 50 is determined in part by the ratio of resistive values of resistors 55 and 51.

Figure 5:
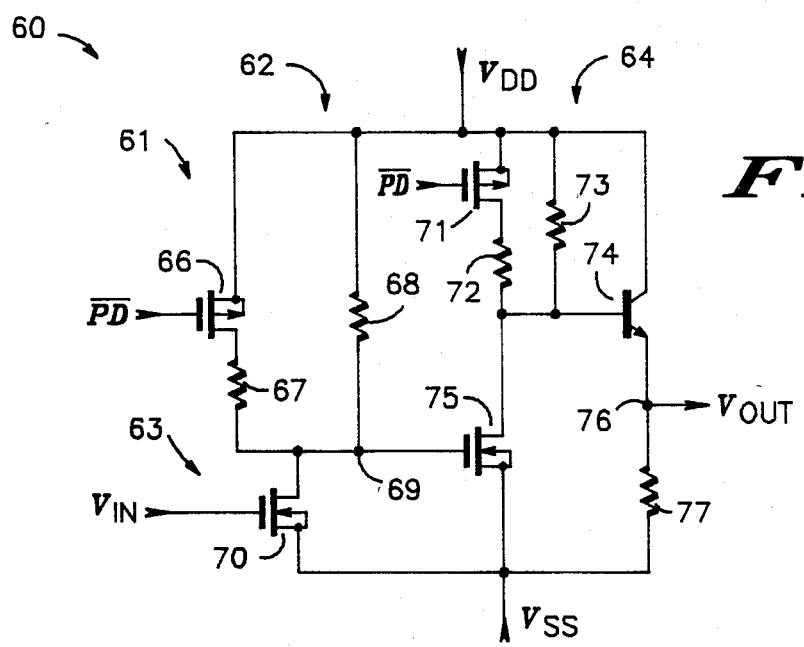
FIG. 5 is another embodiment in schematic form of the present invention.

Shown in FIG. 5 is an amplifier circuit 60 which is yet another embodiment of the present invention which illustrates that the present invention may be utilized with many amplifier configurations other than a differential amplifier. Amplifier circuit 60 generally comprises a first bias current portion 61, a second bias current portion 62, an input portion 63 and a gain portion 64.

First bias current portion 61 comprises a P-channel transistor 66 having a source connected to supply voltage $V_{DD}$, a gate connected to the active low form of power down signal PD, and a drain connected to a first terminal of a resistor 67. Second bias current portion 62 comprises a resistor 68 having a first terminal connected to supply voltage $V_{DD}$ and a second terminal connected to a second terminal of resistor 67 at a node 69. Input portion 63 comprises an N-channel transistor 70 having a drain connected to node 69, a gate connected to an input voltage $V_{IN}$, and a source connected to supply voltage $V_{SS}$. Gain portion 64 comprises a P-channel transistor 71 having a source connected to supply voltage $V_{DD}$, a gate connected to the active low form of the power down signal PD, and a drain. A resistor 72 has a first terminal connected to the drain of transistor 72, and a second terminal. A resistor 73 has a first terminal connected to supply voltage $V_{DD}$ and a second terminal connected to the second terminal of resistor 72. An NPN bipolar transistor 74 has a collector connected to supply voltage $V_{DD}$, a base connected to the second terminals of resistors 72 and 73, and an emitter. An N-channel transistor 75 has a drain connected to the second terminals of resistors 72 and 73, a gate connected to node 69, and a source connected to supply voltage $V_{SS}$. A resistor 77 has a first terminal connected to the emitter of transistor 74 at an output node 76 for providing an output voltage $V_{OUT}$. A second terminal of resistor 77 is connected to supply voltage $V_{SS}$. In a preferred form, the substrates of all P-channel transistors are connected to supply voltage $V_{DD}$ and the substrates of all N-channel transistors are connected to supply voltage $V_{SS}$.

In operation, resistor 68 functions to provide a constant minimal bias current to transistor 70. Transistor 66 functions as a switch in response to the active high form of power down signal PD to selectively enable resistor 67 to provide a bias current to transistor 70 when amplifier circuit 60 is powered up. Assuming that a conventional D.C. feedback circuit (not shown) is used with circuit 60 to maintain quiescent voltages at the input, when circuit 60 is disabled or is in a power down mode, node 69 is biased close to the quiescent value by current supplied from resistor 68. As a result, when the circuit is powered up, transistor 75 is quickly made conductive. Voltage transients which may appear at the gate of transistor 74 due to analogous reasons as previously discussed are therefore immediately suppressed by sinking the transient current to supply voltage $V_{SS}$ via transistor 75. Similarly, resistor 73 functions as a minimal bias current source for biasing transistor 74. Transistor 71 and resistor 72 function as a second bias current source for selectively biasing transistor 74 when circuit 60 is powered up. Therefore, transistor 74 is biased near its quiescent bias point when circuit 60 is in a power down mode. Resistor 77 is a load impedance used to establish, in part, the bias current for transistor 74. It should be apparent that although transient output voltage spikes are reduced by both the use of bias current portions 61 and 62 and resistors 72 and 73 and transistor 71, the present invention may be practised by using only bias current portions 61 and 62.

While the invention has been described in the context of several embodiments, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A circuit for minimizing output voltage transients in an operational amplifier resulting from powering up the operational amplifier, said operational amplifier providing an output voltage proportional to a differential between first and second input voltages coupled to a pair of differential input transistors, comprising:
   first current source means coupled to the pair of input transistors, for selectively providing to said differential input transistors a first bias current proportional to a bias voltage;
   second current source means coupled in parallel to the first current source means, for constantly providing to the differential input transistors a predetermined minimal second bias current proportional to the bias voltage; and
   switching means coupled to the first current source means, for selectively disabling the first current source means in response to a power control signal.

2. The circuit for minimizing output voltage transients of claim 1 wherein the first current source means comprise:
   a transistor having a first current electrode coupled to a first supply terminal, a control electrode coupled to the switching means, and a second current electrode coupled to the pair of differential input transistors.

3. The circuit for minimizing output voltage transients of claim 1 wherein the second current source means comprise:
   a transistor having a first current electrode coupled to a terminal for receiving a supply voltage, a control electrode for receiving said bias voltage, and a second current electrode coupled to the pair of differential input transistors.

4. The circuit for minimizing output voltage transients of claim 1 wherein the switching means comprise:
   a transistor having a control electrode coupled to a terminal for receiving the power control signal, a first current electrode coupled to a terminal for receiving a supply voltage, and a second current electrode coupled to the first current source means, for disabling the first current source means in response to the power control signal; and
   a CMOS transmission gate having a first terminal coupled to the first current source means, a second terminal coupled to a terminal for receiving the bias voltage, a first control input for receiving an active high form of the power control signal, and a second control input for receiving an active low form of the power control signal.

5. The circuit for minimizing output voltage transients of claim 2, further comprising:
   capacitance means having a first electrode coupled to the first current electrode of the transistor, and a second electrode coupled to the control electrode of the transistor, for limiting rise and fall times of voltages at the control electrode of the transistor.

6. An amplifier circuit for minimizing output voltage transients, comprising:
   input means for receiving an input voltage;
   first bias current source means for providing a first bias current to the input means;
   second bias current source means selectively coupled in parallel with the first bias current source means for providing a second bias current to the input means, said first bias current being substantially smaller than said second bias current;
   switch means for selectively disabling the second bias current source means in response to a power control signal; and
   output means coupled to the input means for providing an output voltage having minimized power-up voltage distortion.

7. The amplifier circuit of claim 6 wherein said first bias current source means comprise:
   a first transistor having a first current electrode coupled to a terminal for receiving a supply voltage, a control electrode coupled to a terminal for receiving a bias voltage, and a second current electrode coupled to the input means.

8. The amplifier circuit of claim 7 wherein said second bias current source means comprise:
   a second transistor having a first current electrode coupled to the terminal for receiving the supply voltage, a control electrode selectively coupled to either the supply voltage or to the bias voltage in response to the power control signal, and a second current electrode coupled to the input means.

9. The amplifier circuit of claim 8 wherein said switch means comprise:
   a third transistor having a first current electrode coupled to the terminal for receiving the supply voltage, a control electrode for receiving the control signal, and a second current electrode coupled to the control electrode of the first transistor; and
   a switch having a first terminal coupled to the control electrode of the second transistor, a second terminal coupled to the terminal for receiving the bias voltage, and a control terminal coupled to the power control signal.

10. The amplifier circuit of claim 6 wherein said first bias current source means comprise:
    a first resistor having a first terminal coupled to a terminal for receiving a supply voltage, and a second terminal coupled to the input means.

11. The amplifier circuit of claim 10 wherein said switch means comprise:
    a transistor having a first current electrode coupled to the terminal for receiving the supply voltage, a control electrode coupled to a terminal for receiving the power control signal, and a second current electrode coupled to the second bias current source means.

12. The amplifier circuit of claim 11 wherein said second bias current source means comprise:
    a second resistor having a first terminal coupled to the second current electrode of the transistor, and a second terminal coupled to the input means.

13. A method of minimizing output voltage power-up transients in an amplifier circuit, comprising the steps of:
    receiving an input voltage to be amplified via input means;
    selectively providing a first bias current to the input means in response to a control signal for controlling availability of power to the input means; and
    constantly providing a second bias current to the input means which is less than the first bias current and which establishes a bias voltage to an output amplifier portion which approximates a quiescent operating voltage, thereby providing substantially instantaneous circuit operation upon powering up the circuit to limit output voltage power-up transients.

14. An amplifier circuit which minimizes output voltage transients, comprising:
    a first transistor having a first current electrode coupled to a terminal for receiving a supply voltage, a control electrode coupled to a terminal for receiving a bias voltage, and a second current electrode;
    a second transistor having a first current electrode coupled to the terminal for receiving the supply voltage, a control electrode, and a second current electrode coupled to the second current electrode of the first transistor;
    a third transistor having a first current electrode coupled to the terminal for receiving the supply voltage, a control electrode coupled to a power control signal, and a second current electrode coupled to the control electrode of the second transistor;
    a switch having a first terminal coupled to the control electrode of the second transistor, a second terminal coupled to the terminal for receiving the bias voltage, and a control terminal coupled to the power control signal;
    input means coupled to the second current electrodes of the first and second transistors, for receiving an input voltage; and
    output amplifier means coupled to the input means, for providing an output signal having substantially no output voltage transients in response to powering up the amplifier circuit.

15. The amplifier circuit of claim 14 further comprising:
    capacitance means having a first electrode coupled to the terminal for receiving the supply voltage, and a second electrode coupled to the control electrode of the second transistor, said capacitance means limiting rise and fall times of voltages at the control electrode of the second transistor.

* * * * *